US009198312B2

(12) United States Patent
Zhang et al.

(10) Patent No.: US 9,198,312 B2
(45) Date of Patent: Nov. 24, 2015

(54) AUTOMATIC HINGE LOCKING ASSEMBLY FOR ELECTRONIC DEVICE (75) Inventors: Ming Zhang, Shanghai (CN); Shanjun Deng, Shanghai (CN); Xiaofeng Sheng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 13/976,151

(22) PCT Filed: Mar. 31, 2011

(86) PCT No.: PCT/CN2011/000554
§ 371 (c)(1),
(2), (4) Date: Nov. 21, 2013

(87) PCT Pub. No.: WO2012/129728
PCT Pub. Date: Oct. 4, 2012

(65) Prior Publication Data
US 2014/0084772 A1 Mar. 27, 2014

(51) Int. Cl.
*E05D 3/10* (2006.01)
*H05K 5/02* (2006.01)
(Continued)

(52) U.S. Cl.
CPC .............. *H05K 5/0226* (2013.01); *G06F 1/162* (2013.01); *G06F 1/1681* (2013.01); *H04M 1/0212* (2013.01); *Y10T 16/54* (2015.01)

(58) Field of Classification Search
CPC ... G06F 1/1616; G06F 1/1679; G06F 1/1681; G06F 1/1622; G06F 1/162; H05K 5/0226; E05D 3/122; E05D 3/12; E05D 3/16; E05D 3/18; E05D 3/06; E05D 3/32; E05D 3/10; E05D 11/1021; E05D 11/1078; E05Y 2900/20; E05Y 2900/60; E05Y 2900/606; E04M 1/022; E04M 1/0214; E04M 1/0216; E04M 1/0212; E04M 1/0225; E04M 1/0222

USPC ........... 16/327, 331, 333, 338, 340, 366, 354, 16/357, 360, 346, 345, 368, 369, 286, 291, 16/293, 294, 296, 367; 361/679.08, 361/679.11, 679.02, 679.15, 679.27, 361/679.21, 679.09, 679.22; 455/90.3, 455/575.1, 575.3, 575.8; 379/433.12, 379/433.13; 348/373, 333.01, 333.06, 794; 248/274.1, 284.1, 286.1, 287.1, 419, 248/420
See application file for complete search history.

(56) References Cited

U.S. PATENT DOCUMENTS 6,256,837 B1 * 7/2001 Lan et al. .......................... 16/334
6,804,861 B2 * 10/2004 Hsu ................................. 16/366
(Continued)

FOREIGN PATENT DOCUMENTS

CN 1780541 A 5/2006
CN 1791317 A 6/2006
(Continued)

OTHER PUBLICATIONS

International Preliminary Report on Patentablity and Written Opinion Received for PCT Application No. PCT/CN2011/000554, issued on Oct. 1, 2013, 5 pages.
(Continued)

*Primary Examiner* — Chuck Mah
(74) *Attorney, Agent, or Firm* — Alpine Technology Law Group LLC (57) ABSTRACT

In one embodiment an electronic device comprises a housing having a first section and a second section mounted to the first section by a hinge assembly comprising a base, a swing arm mounted to the base and rotatable about a first axis, and a locking assembly, responsive to a rotation of a shaft coupled to the swing arm, to selectively lock the swing arm to the base. Other embodiments may be described.

17 Claims, 6 Drawing Sheets

(51) Int. Cl.
*G06F 1/16* (2006.01)
*H04M 1/02* (2006.01)

(56) References Cited

U.S. PATENT DOCUMENTS

| | | | |
|---|---|---|---|
| 6,807,711 B2 | 10/2004 | Lu | |
| 6,850,407 B2* | 2/2005 | Tanimoto et al. | 361/679.27 |
| 6,912,122 B2* | 6/2005 | Chen et al. | 361/679.27 |
| 7,076,837 B2* | 7/2006 | Liao | 16/371 |
| 7,150,074 B2* | 12/2006 | Shiba | 16/367 |
| 7,380,313 B2* | 6/2008 | Akiyama et al. | 16/367 |
| 7,757,350 B2* | 7/2010 | Chiang et al. | 16/367 |
| 7,954,203 B2* | 6/2011 | Chen et al. | 16/367 |
| 7,958,602 B2* | 6/2011 | Nishizawa et al. | 16/367 |
| 7,971,321 B2* | 7/2011 | Chen et al. | 16/367 |
| 7,979,960 B2* | 7/2011 | Sano et al. | 16/367 |
| 2004/0049886 A1 | 3/2004 | Lu | |
| 2004/0083577 A1* | 5/2004 | Lu et al. | 16/367 |
| 2005/0160558 A1* | 7/2005 | Kim | 16/367 |
| 2005/0172454 A1 | 8/2005 | Chen et al. | |
| 2005/0198780 A1* | 9/2005 | Liu et al. | 16/367 |
| 2005/0246741 A1* | 11/2005 | Liu et al. | 725/50 |
| 2006/0112516 A1 | 6/2006 | Chen et al. | |
| 2006/0123593 A1 | 6/2006 | Shiba | |
| 2006/0218750 A1* | 10/2006 | Tajima | 16/367 |
| 2006/0230580 A1* | 10/2006 | Watanabe et al. | 16/367 |
| 2006/0279920 A1 | 12/2006 | Lee et al. | |
| 2007/0163082 A1* | 7/2007 | Chen et al. | 16/367 |
| 2007/0169312 A1 | 7/2007 | Ho et al. | |
| 2008/0034549 A1* | 2/2008 | Lee et al. | 16/367 |
| 2008/0078060 A1* | 4/2008 | Chen | 16/367 |
| 2008/0109996 A1* | 5/2008 | Hsu et al. | 16/367 |
| 2008/0115325 A1* | 5/2008 | Chien | 16/367 |
| 2010/0005626 A1* | 1/2010 | Wang et al. | 16/367 |
| 2010/0011539 A1* | 1/2010 | Huang et al. | 16/367 |
| 2013/0335893 A1 | 12/2013 | Liang et al. | |

FOREIGN PATENT DOCUMENTS

| | | |
|---|---|---|
| CN | 201301889 A | 9/2009 |
| CN | 201301889 Y | 9/2009 |
| CN | 202926867 U | 5/2013 |
| EP | 2691662 A1 | 2/2014 |
| JP | 2004-118409 A | 4/2004 |
| JP | 2009-036279 A | 2/2009 |
| TW | 200815684 A | 4/2008 |
| TW | 201008451 A | 2/2010 |
| WO | 2012/129728 A1 | 10/2012 |

OTHER PUBLICATIONS

Notice of Grant received for Chinese Patent Application No. 201120579967.1, mailed on Jan. 23, 2013, 1 page of English Translation and 2 pages of Notice of Grant.

Office Action received for Japan Patent Application No. 2014-501387, mailed on Aug. 19, 2014, 6 pages of Office Action including 3 pages of English Translation.

Office Action received for Chinese Patent Application No. 201180002413.8, mailed on Dec. 2, 2014, 18 pages including 10 pages of English Translation.

International Search Report and Written Opinion received for Patent Application No. PCT/CN2011/000554, mailed on Jan. 5, 2012, 12 pages.

Office Action received for Taiwanese Patent Application No. 100148642, mailed on Mar. 5, 2014, 16 pages of English Translation and 14 pages of Office Action.

Office Action received for Taiwanese Patent Application No. 100148642, mailed on Sep. 19, 2014, 21 pages of Office Action including 10 pages of English Translation.

Extended European Search Report received for European Patent Application No. 11862665.4 mailed on Jun. 26, 2015.

Office Action received for Japanese Patent Application No. 2014-501387, mailed on Jul. 7, 2015, 3 pages including 2 pages of English translation.

Europran Search Report received for European Patent Application No. 11862665.4 mailed on Jun. 26, 2015, 35 pages.

Notice of Allowance received for Japanese Patent Application No. 2014-501387, mailed on Sep. 29, 2015, 2 pages including 1 page of English translation.

* cited by examiner

AUTOMATIC HINGE LOCKING ASSEMBLY FOR ELECTRONIC DEVICE

BACKGROUND

The subject matter described herein relates generally to the field of electronic devices and more particularly to an automatic hinge locking assembly for one or more electronic devices.

Some electronic devices utilize a "clamshell" housing. By way of example, many laptop computers and mobile electronic devices utilize a clamshell housing in which a keyboard is disposed on a first section and a display is disposed on a second section coupled to the first section by a hinge. Accordingly assemblies to manipulate clamshell housings may find utility.

BRIEF DESCRIPTION OF THE DRAWINGS

The detailed description is described with reference to the accompanying figures.

DETAILED DESCRIPTION

Described herein are exemplary apparatus and methods to automatically lock a hinge assembly. In some embodiments the apparatus and methods may find particularly utility in electronic devices. In the following description, numerous specific details are set forth to provide a thorough understanding of various embodiments. However, it will be understood by those skilled in the art that the various embodiments may be practiced without the specific details. In other instances, well-known methods, procedures, components, and circuits have not been illustrated or described in detail so as not to obscure the particular embodiments.

Figure 1:
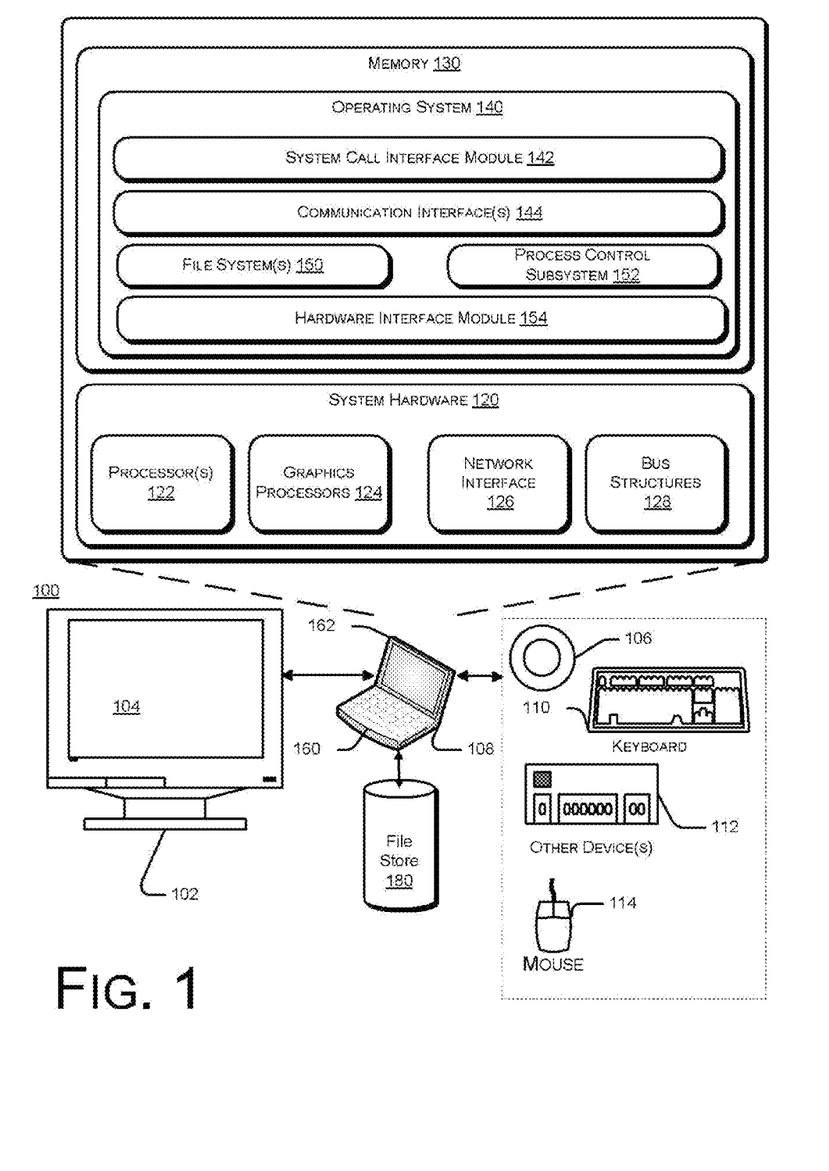
FIG. 1 is a schematic illustration of an exemplary electronic device which may be modified to include an automatic hinge locking assembly in accordance with some embodiments.

FIG. 1 is a schematic illustration of an exemplary electronic device 100 in accordance with some embodiments. In one embodiment, electronic device 100 may include one or more accompanying input/output devices such as one or more speakers 106, a keyboard 110, one or more other I/O device(s) 112, and a mouse 114. The other I/O device(s) 112 may include a touch screen, a voice-activated input device, a track ball, and any other device that allows the electronic device 100 to receive input from a user.

In various embodiments, the electronic device 100 may be embodied as a personal computer, a laptop computer, a personal digital assistant, a mobile telephone, an entertainment device, or another computing device. The electronic device 100 includes system hardware 120 and memory 130, which may be implemented as random access memory and/or read-only memory. A file store 180 may be communicatively coupled to electronic device 100. File store 180 may be internal to computing device 108 such as, e.g., one or more hard drives, CD-ROM drives, DVD-ROM drives, or other types of storage devices. File store 180 may also be external to computer 108 such as, e.g., one or more external hard drives, network attached storage, or a separate storage network.

System hardware 120 may include one or more processors 122, graphics processors 124, network interfaces 126, and bus structures 128. In one embodiment, processor 122 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

In some embodiments one of the processors 122 in system hardware 120 may comprise a low-power embedded processor, referred to herein as a manageability engine (ME). The manageability engine 122 may be implemented as an independent integrated circuit or may be a dedicated portion of a larger processor 122.

Graphics processor(s) 124 may function as adjunct processor that manages graphics and/or video operations. Graphics processor(s) 124 may be integrated onto the motherboard of computing system 100 or may be coupled via an expansion slot on the motherboard.

In one embodiment, network interface 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association. Ver. 3.0.1, December 2002).

Bus structures 128 connect various components of system hardware 128. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB). Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 130 may include an operating system 140 for managing operations of computing device 108. In one embodiment, operating system 140 includes a hardware interface module 154 that provides an interface to system hardware 120. In addition, operating system 140 may include a file system 150 that manages files used in the operation of computing device 108 and a process control subsystem 152 that manages processes executing on computing device 108.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

In one embodiment, electronic device 100, comprises a clamshell body which includes a first section 160, commonly referred to as a base, which houses a keyboard, a motherboard, and other components, and a second section 162 which houses a display. The first section 160 and the second section 162 are connected by a hinge assembly which enables the clamshell body to open and close.

Figure 2A:
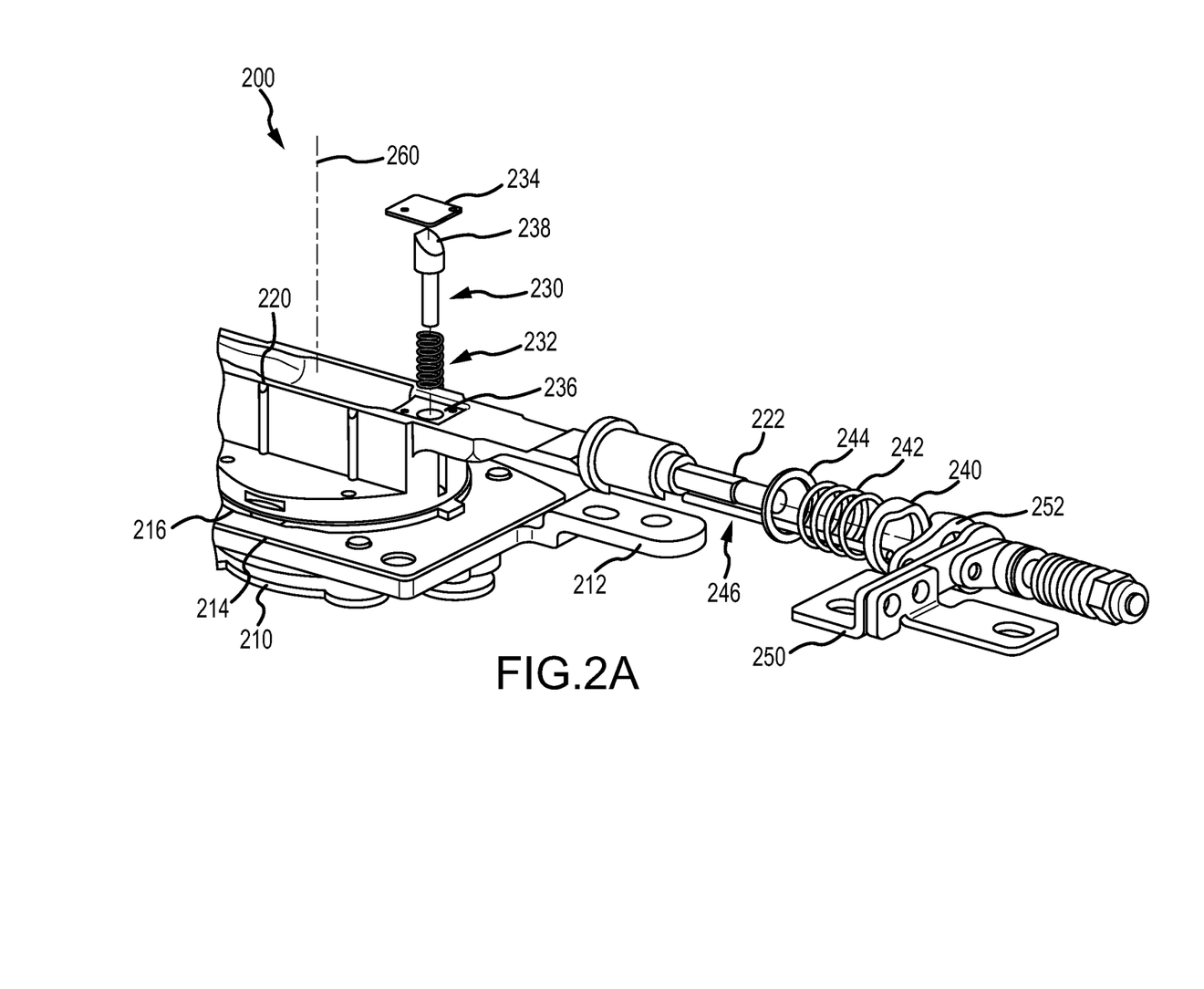
FIG. 2A is a schematic, perspective view illustration of an automatic hinge locking assembly in accordance with some embodiments.

In some embodiments the electronic device 100 may comprise an automatic hinge locking opening assembly which automatically locks and unlocks a display section of the clamshell body of the electronic device 100 in order to prevent and enable, respectively, rotation of the display section of the clamshell body with respect to a base section. Embodiments of an automatic hinge locking assembly will be described with reference to FIGS. 2A-2C. FIG. 2A is a schematic, perspective view illustration of an automatic hinge locking assembly in accordance with some embodiments.

Figure 2B:
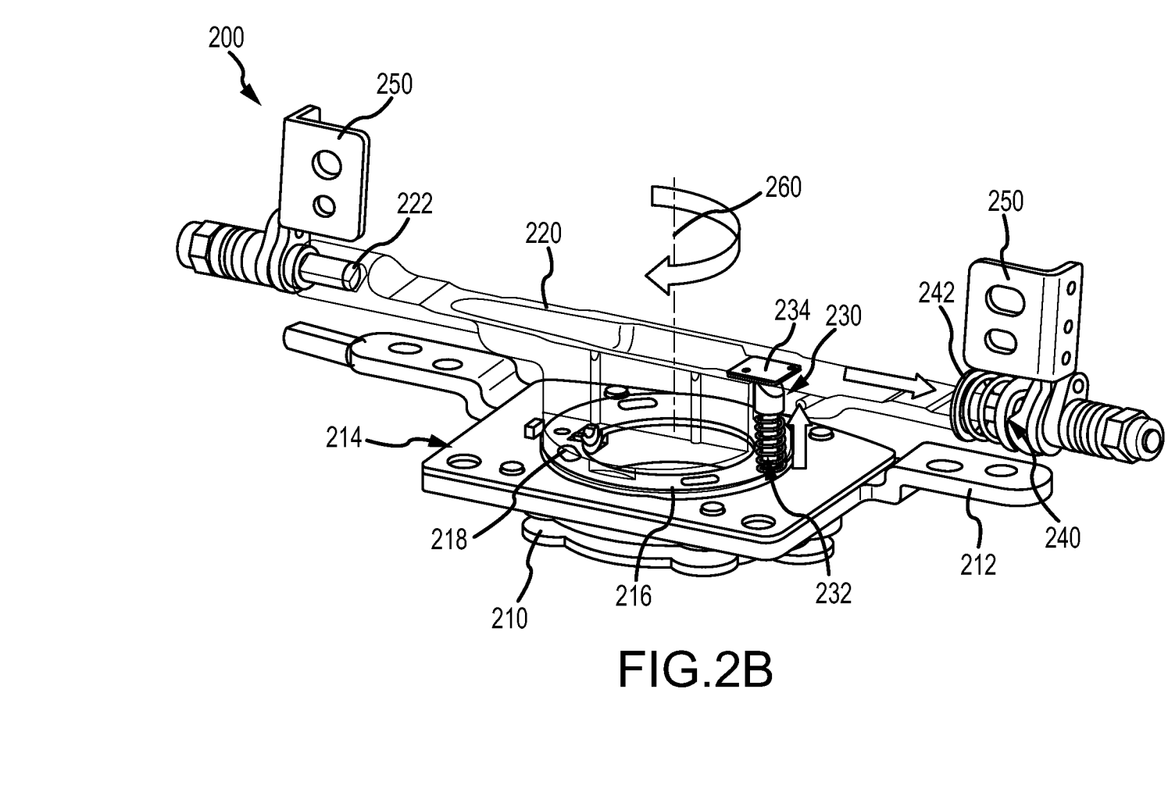
FIG. 2B is a schematic, perspective view illustration a portion of an automatic hinge locking assembly in accordance with some embodiments.
Figure 2C:
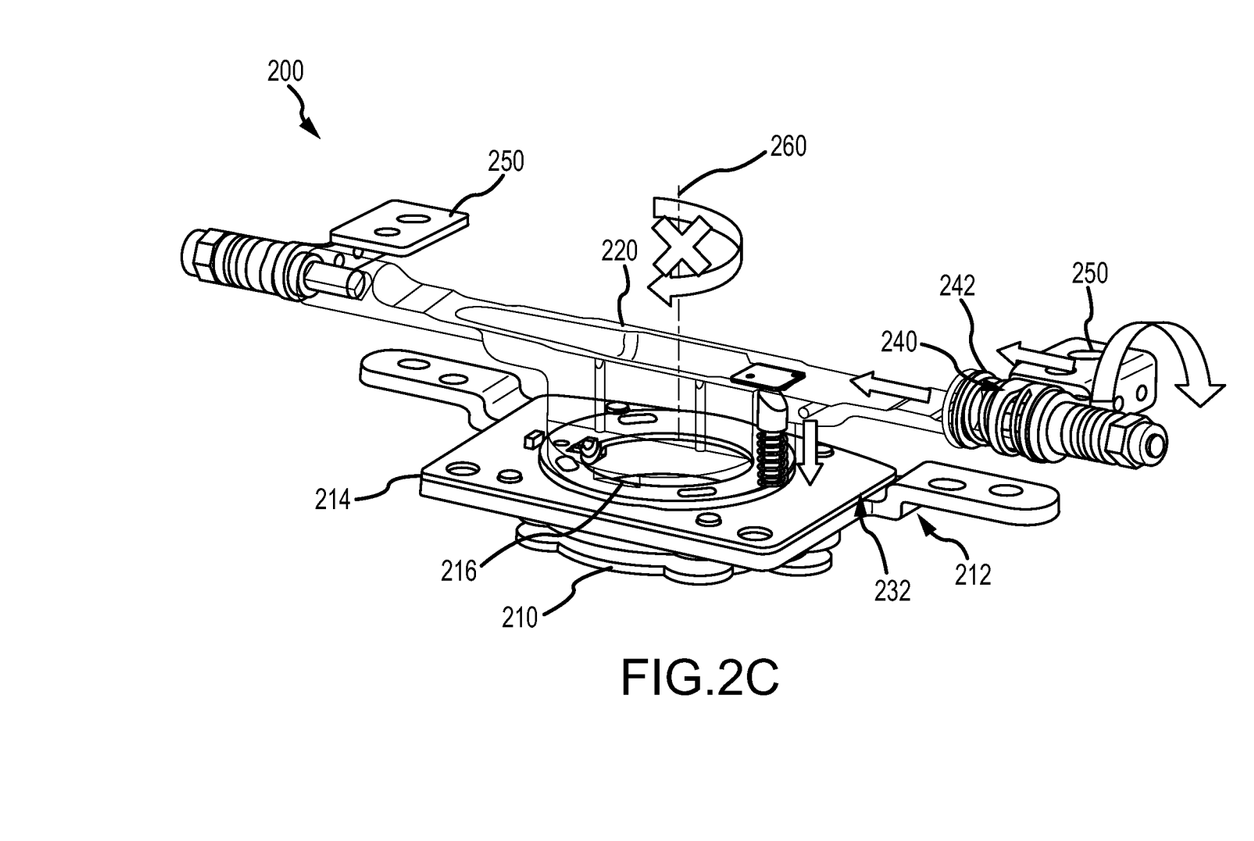
FIG. 2C is a schematic, perspective view illustration a portion of an automatic hinge locking assembly in accordance with some embodiments.

Referring to FIGS. 2A-2C, in some embodiments an automatic hinge opening assembly 200 comprises a base 210, a swing arm 220 mounted to the base 210 and rotatable about a first axis, and a locking assembly, responsive to a rotation of a shaft coupled to the swing arm 222, to selectively lock the swing arm 220 to the base. In some embodiments a locking pin 230 is moveable between a first position in which the swing arm is locked in a fixed position relative to the base and a second position in which the swing arm can rotate about the first axis, a bracket 250 coupled to a shaft 222 connected to the swing arm 220, and a cam 240 coupled to the bracket 250 and comprising a follower arm 246 coupled to the pin 230 such that rotating the bracket 250 about the shaft connected to the swing arm move the locking pin between the first position and the second position.

In greater detail, referring first to FIG. 2A, the base 210 may comprise one or more brackets 212 to secure the base 210 to a housing component for an electronic device. By way of example, in some embodiments the base 210 may be mounted within a first section 160 of an electronic device such as a laptop computer and the swing arm 220 defines a hinge assembly for the second section 162 of the electronic device.

A plate 214 is mounted on the base 210, and an insert 216 is mounted on the plate 214. The swing arm 220 is rotatably mounted on the insert 216 such that the swing arm 220 can rotate about an axis perpendicular to the plane defined by the surface of the insert 216, i.e., a Z-axis 260. In some embodiments the swing arm 220 may rotate a full 360°, while in other embodiments the swing arm 220 may rotate though less than a full 360°.

Swing arm 220 comprises a hole 236 to receive a locking pin 230 which extends through the insert 216 to lock the swing ara 220 to the base 210 such that the swing arm 220 cannot rotate relative to the base 210. A compression spring 232 fits around the locking pin 230 to bias the locking pin 230 in an upward direction such that the swing arm 220 is free to rotate about the base 210. A limit plate 234 serves to limit the upward motion of the locking pin 230 from the bias provided by the compression spring 232. The locking pin 230 includes an inclined surface 238 which cooperates with the follower arm 246 to actuate the locking pin 230.

A shaft 222 is mounted to the end of swing arm 220 to provide a hinge between the first section 160 and the second section 162 of the housing. A bracket 250 is coupled to the shaft 222 to connect the second section 162 of the housing to the shaft 222. The bracket mount 252 includes a cammed surface which mates with a cam 240 to drive a follower arm 246 which in turn actuates the locking pin 230. A bias spring 242 and washer 244 are also mounted on shaft 222. Operation of the hinge assembly will described in greater detail below.

FIG. 2B is a schematic illustration of the full assembly 200 in greater detail. The base 210 is illustrated in block format and the swing arm 220 is illustrated in line format such that internal components are visible in the drawing. In the embodiment depicted in FIG. 2B, the swing arm 220 includes two hinge brackets 250 mounted on shafts 222 on opposing sides of the swing arm 220. When the swing arm 220 is assembled the compression spring 242 urges the cam 240 against the bracket mount 250. Similarly, the compression spring 232 urges the locking pin upwardly. The limit plate 240 limits the range of motion of the locking pin in an upward direction.

In the embodiment depicted in FIG. 2B the mounting brackets 250 are in an upright position, which would correspond to the clamshell cover of an electronic device being open. In this configuration the cammed surface of the bracket mount 252 is not engaged with the cam 240, and the compression spring 242 urges the cam 240 toward the mounting bracket 250, in the direction indicted by the arrow, such that the follower arm 246 is in a position that allows the compression spring 232 to force the locking pin 230 in an upward direction so the swing arm 220 is free to rotate about the axis 260.

FIG. 2C depicts the swing arm assembly when the brackets 250 are in a closed position, which would correspond to the clamshell cover of an electronic device being closed. In this configuration the cammed surface of the bracket mount 252 is engaged with the cam 240, and the force generated by the cammed surfaces compresses the spring 242 and drives the follower arm 246 in the direction indicated by the arrow on the swing arm 220. The follower arm 246 impinges upon the inclined surface 238 of the locking pin 230 such that motion of the follower arm 246 forces the locking pin 230 in an downward direction into the hole 236 (FIG. 2A) so the swing arm 220 is locked to the base 210.

Figure 3A:
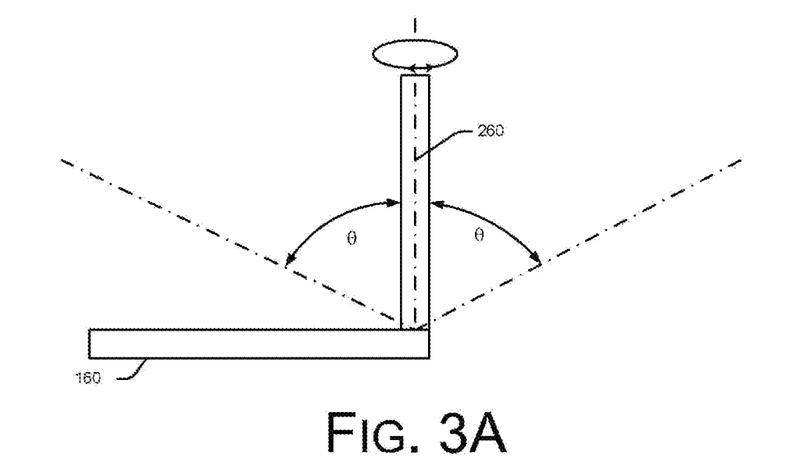
FIGS. 3A and 3B are schematic illustrations of an electronic device adapted to include an automatic hinge locking assembly in accordance with some embodiments.
Figure 3B:
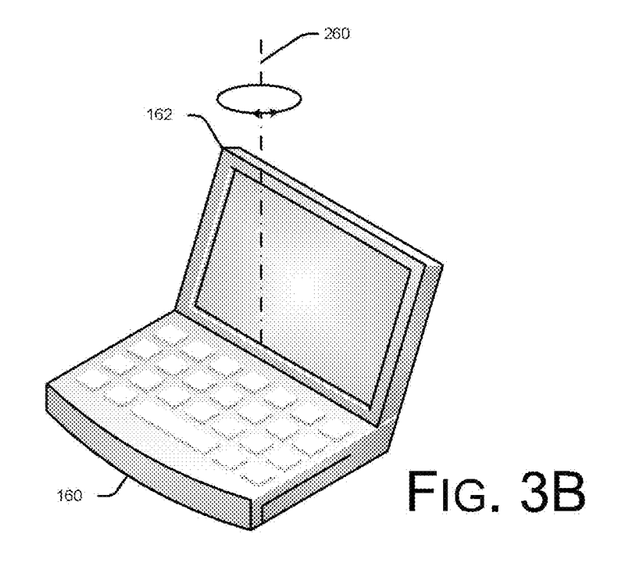

Thus, the cammed surfaces of the hinge bracket 250 and the cam 240 define a range of angular motion through which the bracket 250 may rotate on the shaft 222 which, in turn, allows the swing arm 220 to rotate with respect to the base 210. Thus, referring to FIG. 3A, when the assembly 200 is mounted in a housing on an electronic device, an angular range between the first section 160 and the second section 162 is defined in which the second section 162 may be rotated about an axis perpendicular to the plane of the first section 160 (i.e., a Z-axis 260) to provide a display panel that is rotatable about a Z-axis within a first angular range of motion and that is not rotatable about the Z-axis within a second range of motion. In FIG. 3A the first angular range of motion, indicated by the symbol θ, is approximately 90° plus or minus 60°. Thus, when the electronic device is closed the cam 240 and follower arm 242 force the locking pin 230 into the hole 236 to lock the swing arm 220 in place relative to the base 210. As the electronic device is opened the cammed surface of the bracket mount 252 and the cam 240 disengage, allowing the compression spring 232 to push the locking pin 230 out of the hole 236 such that the swing arm 220 and the second section 162 can rotate about the Z-axis 260.

In the embodiment depicted in FIGS. 2A-2C the insert 216 has two holes 218 on opposing sides of the insert 216 to receive the locking pin 230. The two different holes 218 define four distinct positions in which the housing can be locked from rotation about the Z-axis 260. The first position corresponds to the clamshell housing being closed. The second position corresponds to the clamshell housing being opened past the angular range that permits rotation about the Z-axis 260. The third position corresponds to the clamshell housing being opened and rotating the second section 162 by 180° about the z-axis, then closed back down onto the first section 160. This third position allows the display section of a laptop computer to be folded back on top of the base section such that the laptop can be used like a tablet computer. The fourth position corresponds to the clamshell housing being opened past the angular range that permits rotation about the Z-axis 260 when the second section 162 is rotated When the bracket 250 is positioned within the angular range that permits assembly 200 to rotate the One skilled in the art will recognize that the locking pin 230 arrangement limits the angular range of motion of the second section 162 of the housing with respect to the first section 160 of the housing swing arm 220 is rotated about the Z-axis 260. More particularly, the second section 162 cannot be moved outside the angular range of motion that allows for rotation when the locking pin 230 is not aligned with a hole 218 in the insert 216. Further, one skilled in the art will recognize that the pin 230 may be biased in the opposite direction such that the pin 230 is biased to lock the swing arm 220 to the base 210. In this embodiment the follower arm 246 of the cam may be positioned to urge the pin 230 in an upward direction to unlock the swing arm 220 from the base 210.

Figure 4:
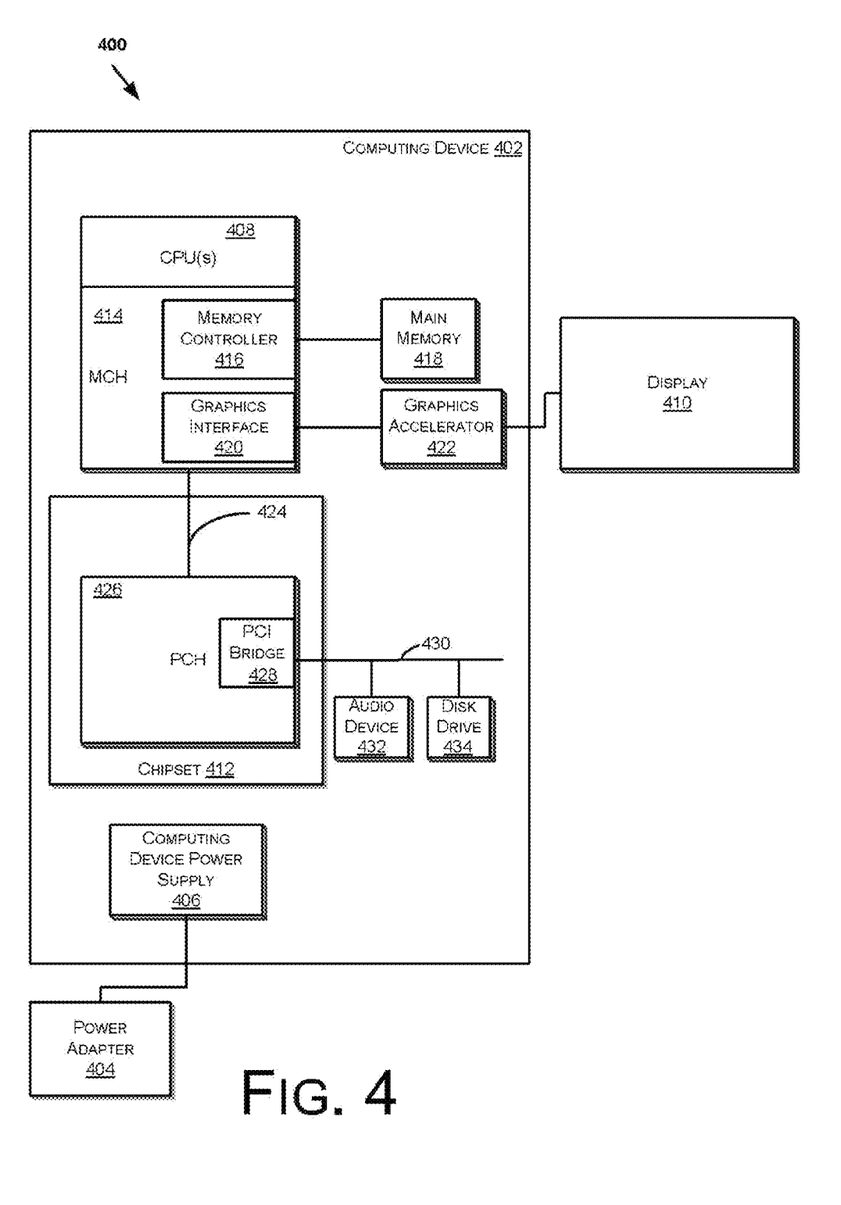
FIG. 4 is a schematic illustration of an electronic device which may be adapted to be locked, according to an embodiment.

As described above, in some embodiments the electronic device may be embodied as a computer system. FIG. 4 is a schematic illustration of a computer system 400 in accordance with some embodiments. The computer system 400 includes a computing device 402 and a power adapter 404 (e.g., to supply electrical power to the computing device 402). The computing device 402 may be any suitable computing device such as a laptop (or notebook) computer, a personal digital assistant, a desktop computing device (e.g., a workstation or a desktop computer), a rack-mounted computing device, and the like.

Electrical power may be provided to various components of the computing device 402 (e.g., through a computing device power supply 406) from one or more of the following sources: one or more battery packs, an alternating current (AC) outlet (e.g., through a transformer and/or adaptor such as a power adapter 404), automotive power supplies, airplane power supplies, and the like. In some embodiments, the power adapter 404 may transform the power supply source output (e.g., the AC outlet voltage of about 110 VAC to 240 VAC) to a direct current (DC) voltage ranging between about 5 VDC to 12.6 VDC. Accordingly, the power adapter 404 may be an AC/DC adapter.

The computing device 402 may also include one or more central processing unit(s) (CPUs) 408. In some embodiments, the CPU 408 may be one or more processors in the Pentium® family of processors including the Pentium® II processor family, Pentium® III processors, Pentium®. IV, or CORE2 Duo processors available from Intel® Corporation of Santa Clara, Calif. Alternatively, other CPUs may be used, such as Intel's Itanium®, XEON™, and Celeron® processors. Also, one or more processors from other manufactures may be utilized. Moreover, the processors may have a single or multi core design.

A chipset 412 may be coupled to, or integrated with, CPU 408. The chipset 412 may include a memory control hub (MCH) 414. The MCH 414 may include a memory controller 416 that is coupled to a main system memory 418. The main system memory 418 stores data and sequences of instructions that are executed by the CPU 408, or any other device included in the system 400. In some embodiments, the main system memory 418 includes random access memory (RAM); however, the main system memory 418 may be implemented using other memory types such as dynamic RAM (DRAM), synchronous DRAM (SDRAM), and the like. Additional devices may also be coupled to the bus 410, such as multiple CPUs and/or multiple system memories.

The MCH 414 may also include a graphics interface 420 coupled to a graphics accelerator 422. In some embodiments, the graphics interface 420 is coupled to the graphics accelerator 422 via an accelerated graphics port (AGP). In some embodiments, a display (such as a flat panel display) 440 may be coupled to the graphics interface 420 through, for example, a signal converter that translates a digital representation of an image stored in a storage device such as video memory or system memory into display signals that are interpreted and displayed by the display. The display 440 signals produced by the display device may pass through various control devices before being interpreted by and subsequently displayed on the display.

A hub interface 424 couples the MCH 414 to an platform control hub (PCH) 426. The PCH 426 provides an interface to input/output (I/O) devices coupled to the computer system 400. The PCH 426 may be coupled to a peripheral component interconnect (PCI) bus. Hence, the PCH 426 includes a PCI bridge 428 that provides an interface to a PCI bus 430. The PCI bridge 428 provides a data path between the CPU 408 and peripheral devices. Additionally, other types of I/O interconnect topologies may be utilized such as the PCI Express™ architecture, available through Intel® Corporation of Santa Clara, Calif.

The PCI bus 430 may be coupled to an audio device 432 and one or more disk drive(s) 434. Other devices may be coupled to the PCI bus 430. In addition, the CPU 408 and the MCH 414 may be combined to form a single chip. Furthermore, the graphics accelerator 422 may be included within the MCH 414 in other embodiments.

Additionally, other peripherals coupled to the PCH 426 may include, in various embodiments integrated drive electronics (IDE) or small computer system interface (SCSI) hard drive(s), universal serial bus (USB) port(s), a keyboard, a mouse, parallel port(s), serial port(s), floppy disk drive(s), digital output support (e.g., digital video interface (DVI)), and the like. Hence, the computing device 402 may include volatile and/or nonvolatile memory.

The terms "logic instructions" as referred to herein relates to expressions which may be understood by one or more machines for performing one or more logical operations. For example, logic instructions may comprise instructions which are interpretable by a processor compiler for executing one or more operations on one or more data objects. However, this is merely an example of machine-readable instructions and embodiments are not limited in this respect.

The terms "computer readable medium" as referred to herein relates to media capable of maintaining expressions which are perceivable by one or more machines. For example, a computer readable medium may comprise one or more storage devices for storing computer readable instructions or data. Such storage devices may comprise storage media such as, for example, optical, magnetic or semiconductor storage media. However, this is merely an example of a computer readable medium and embodiments are not limited in this respect.

The term "logic" as referred to herein relates to structure for performing one or more logical operations. For example, logic may comprise circuitry which provides one or more output signals based upon one or more input signals. Such circuitry may comprise a finite state machine which receives a digital input and provides a digital output, or circuitry which provides one or more analog output signals in response to one or more analog input signals. Such circuitry may be provided in an application specific integrated circuit (ASIC) or field programmable gate array (FPGA). Also, logic may comprise machine-readable instructions stored in a memory in combination with processing circuitry to execute such machine-readable instructions. However, these are merely examples of structures which may provide logic and embodiments are not limited in this respect.

Some of the methods described herein may be embodied as logic instructions on a computer-readable medium. When executed on a processor, the logic instructions cause a processor to be programmed as a special-purpose machine that implements the described methods. The processor, when configured by the logic instructions to execute the methods described herein, constitutes structure for performing the described methods. Alternatively, the methods described herein may be reduced to logic on, e.g., a field programmable gate array (FPGA), an application specific integrated circuit (ASIC) or the like.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" or "some embodiments" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus, comprising:
a base;
a swing arm mounted to the base and rotatable about a first axis; and
a locking assembly, responsive to a rotation of a shaft about a second axis, different from the first axis, coupled to the swing arm, to selectively lock the swing arm to the base, wherein the locking assembly comprises:
a pin moveable between a first position in which the swing arm is locked in a fixed position relative to the base and a second position in which the swing arm can rotate relative to the base about the first axis;
a bracket mount coupled to the shaft connected to the swing arm; and
a cam adjacent the bracket mount and coupled to a follower arm such that rotating the shaft about a second axis, different from the first axis moves the pin between the first position and the second position.

2. The apparatus of claim 1, wherein the swing arm and the base each comprise at least one hole through which the pin can slide to lock the swing arm to the base.

3. The apparatus of claim 1, wherein:
the swing arm is rotatable through a full 360° rotation about the first axis; and
the base comprises a plurality of holes positioned to receive the pin such that the swing arm may be locked to the base plate in a plurality of positions.

4. The apparatus of claim 1, further comprising a bias mechanism to bias the pin in the second position in which the swing arm is rotatable about the first axis with respect to the base, and wherein rotating the shaft from a first orientation to a second orientation forces the pin into one of the plurality of holes to the first position in order to lock the swing arm to the base.

5. The apparatus of claim 4, further comprising a limit plate to limit the motion of the pin in a first direction relative to the limit plate.

6. The apparatus of claim 1, further comprising a bias mechanism to bias the pin in the first position in which the pin is in one of the plurality of holes to lock the swing arm to the base, and wherein rotating the shaft from a first orientation to a second orientation forces the pin into the second position in which the swing arm is rotatable about the first axis with respect to the base.

7. A housing for an electronic device, comprising:
a first section;
a second section mounted to the first section by a hinge assembly comprising:
a base;
a swing arm mounted to the base and rotatable about a first axis; and
a locking assembly, responsive to a rotation of a shaft about a second axis, different from the first axis, coupled to the swing arm, to selectively lock the swing arm to the base, wherein the locking assembly comprises:
a pin moveable between a first position in which the swing arm is locked in a fixed position relative to the base and a second position in which the swing arm can rotate relative to the base about the first axis;
a bracket mount coupled to the shaft connected to the swing arm; and
a cam adjacent the bracket mount and coupled to a follower arm such that rotating the shaft about a second axis, different from the first axis moves the pin between the first position and the second position.

8. The housing of claim 7, wherein the swing arm and the base each comprise at least one hole through which the pin can slide to lock the swing arm to the base.

9. The housing of claim 7, wherein:
the swing arm is rotatable through a full 360° rotation about the first axis; and
the base comprises a plurality of holes positioned to receive the pin such that the swing arm may be locked to the base plate in a plurality of positions.

10. The housing of claim 9, further comprising a bias mechanism to bias the pin in the second position in which the swing arm is rotatable about the first axis with respect to the base, and wherein rotating the shaft from a first orientation to a second orientation forces the pin into one of the plurality of holes to the first position in order to lock the swing arm to the base.

11. The housing of claim 10, further comprising a limit plate to limit the motion of the pin in a first direction relative to the limit plate.

12. The housing of claim 9, further comprising a bias mechanism to bias the pin in the first position in which the pin is in one of the plurality of holes to lock the swing arm to the base, and wherein rotating the shaft from a first orientation to a second orientation forces the pin into the second position in which the swing arm is rotatable about the first axis with respect to the base.

13. An electronic device, comprising:
a housing having a first section and a second section mounted to the first section by a hinge assembly comprising:
   a base;
   a swing arm mounted to the base and rotatable about a first axis; and
   a locking assembly, responsive to a rotation of a shaft about a second axis, different from the first axis, coupled to the swing arm, to selectively lock the swing arm to the base, wherein the locking assembly comprises:
      a pin moveable between a first position in which the swing arm is locked in a fixed position relative to the base and a second position in which the swing arm can rotate relative to the base about the first axis;
      a bracket mount coupled to the shaft connected to the swing arm; and
      a cam adjacent the bracket mount and coupled to a follower arm such that rotating the shaft about a second axis, different from the first axis moves the pin between the first position and the second position.

14. The electronic device of claim 13, wherein the swing arm and the base each comprise at least one hole through which the pin can slide to lock the swing arm to the base.

15. The electronic device of claim 13, wherein:
the swing arm is rotatable through a full 360° rotation about the first axis; and
the base comprises a plurality of holes positioned to receive the pin such that the swing arm may be locked to the base plate in a plurality of positions.

16. The electronic device of claim 15, further comprising a bias mechanism to bias the pin in the second position in which the swing arm is rotatable about the first axis with respect to the base, and wherein rotating the shaft from a first orientation to a second orientation forces the pin into one of the plurality of holes to the first position in order to lock the swing arm to the base.

17. The electronic device of claim 16, further comprising a limit plate to limit the motion of the pin in a first direction relative to the limit plate.

* * * * *